US006088253A

United States Patent [19]

Shimizu

[11] Patent Number: 6,088,253

[45] Date of Patent: Jul. 11, 2000

[54] SEMICONDUCTOR MEMORY DEVICE AND METHOD FOR FORMING SAME

[75] Inventor: Yoshiaki Shimizu, Kanagawa, Japan

[73] Assignee: NEC Corporation, Tokyo, Japan

[21] Appl. No.: 09/438,844

[22] Filed: Nov. 12, 1999

[30] Foreign Application Priority Data

Nov. 12, 1998 [JP] Japan .................................. 10-321824

[51] Int. Cl.[7] ........................................................ G11C 5/02

[52] U.S. Cl. .......................... 365/51; 365/63; 365/230.08

[58] Field of Search ......................... 365/51, 233, 189.05, 365/230.08, 63

[56] References Cited

U.S. PATENT DOCUMENTS 5,122,693 6/1992 Honda et al. ........................... 307/480
5,376,842 12/1994 Honoa et al. ............................. 326/21
6,005,412 12/1999 Ranjan et al. ............................ 326/63

*Primary Examiner*—David Nelms
*Assistant Examiner*—Thong Le
*Attorney, Agent, or Firm*—McGinn & Gibb, P.C.

[57] ABSTRACT

A synchronous DRAM has a plurality of data pads formed into a data pad row, a plurality of data latch circuits for latching signals from each of the data pads, these data latch circuits being disposed in a region surrounded by a second straight line that is perpendicular to a first straight line that passes over the data pad row and that passes one end of the data pad row, and a third straight line that is parallel to the second straight line and that passes the other end of the data pad row. The length of interconnections from the plurality of data latch circuits to an internal clock signal generating circuit being made the same length, the length of the interconnection between each first stage circuit to each data latch circuit being made the same as the length of the interconnection from the internal clock signal generating circuit to the data latch circuits, and the first stage circuits, the data latch circuits, and the internal clock signal generating circuit being operated by a voltage that is dropped down from an external power supply.

14 Claims, 10 Drawing Sheets

| | | |
|---|---|---|
| DATA LATCHING | GOOD | ○ |
| CLK BUFFER | SMALL | ○ |
| CURRENT CONSUMPTION | SMALL | ○ |
| WIRING REGION | MEDIUM | △ |
| ELEMENT REGION | SMALL | ○ |

(a)

(b)

| | | |
|---|---|---|
| DATA LATCHING | IMPOSSIBLE | × |
| CLK BUFFER | MEDIUM | △ |
| CURRENT CONSUMPTION | SMALL | ○ |
| WIRING REGION | SMALL | ○ |
| ELEMENT REGION | MEDIUM | △ |

(a)

| | | |
|---|---|---|
| DATA LATCH | POSSIBLE | ○ |
| CLK BUFFER | VERY LARGE | × |
| CURRENT CONSUMPTION | LARGE | × |
| WIRING REGION | LARGE | × |
| ELEMENT REGION | LARGE | × |

(b)

| | | |
|---|---|---|
| DATA LATCH | POSSIBLE | ○ |
| CLK BUFFER | SMALL | ○ |
| CURRENT CONSUMPTION | LARGE | × |
| WIRING REGION | MEDIUM | △ |
| ELEMENT REGION | LARGE | ○ |

SEMICONDUCTOR MEMORY DEVICE AND METHOD FOR FORMING SAME

BACKGROUND OF THE INVENTION

1. Field of the Invention

The present invention relates to a semiconductor memory device and a method for forming a semiconductor memory device, and more particularly to a circuit arrangement method that is suitable for use in a DDR SDRAM (double data rate synchronous DRAM).

2. Background of the Invention

FIG. 7 shows a block diagram of the write system of a SDR type SDRAM (single data rate synchronous DRAM), FIG. 7(*a*) being an example in which within a region in which data latch circuits 121, 122, . . . 12n are disposed between a second straight line 112 which is perpendicular to a first straight line 111 that passes over pads 101 through 10n and which also passes over the data pad 101, and a third straight line 113, which is parallel to the second straight line 112 and which also passes over the pad 10n, a plurality of data latch circuits 121 to 12n are distributed, which latch signals from the data pads, and FIG. 7(*b*) being an example in which a data latch group 210 comprising a plurality of data latch circuits is centrally located in a region that is surrounded by the second straight line 112 and the third straight line 113.

In the case of FIG. 7(*b*), because the wiring between the first stage and the data latch circuit is long, the power consumption and wiring area are large, the result being that the wiring method shown in FIG. 7(*a*) was used in SDR DRAMs of the past.

When designing a DDR SDRAM (double data rate synchronous DRAM), however, as shown in FIG. 8, if the same arrangement as shown in FIG. 7(*a*) is used, it becomes impossible to latch data, as shown by the data latch timing diagram of FIG. 9. This is because, whereas in the case of a SDR DRAM the timing of data latching is only at the rising edge of the clock signal, with a DDR DRAM because data is latched at both the rising and falling edges of the clock signal, so that there is double the number of operations as with an SDR DRAM, the data hold time is halved from what it was in the past, making the timing conditions more severe, so as to prevent latching of data.

The reasons that data cannot be latched have been demonstrated to be variation in time delay caused by differences in the length of wiring from the each of the data latch circuits 121 through 12n to the internal clock (CLK) signal generating circuit 130, and delay time skews between the internal clock delay time (tCLK delay) and the external clock, and between an internal data delay time (tDQ delay) and external data.

Accordingly, it is an object of the present invention, in view of the above-noted drawbacks in the related art, to provide a novel semiconductor memory device which improves on the above-noted problems, and which features interconnect and element regions of reduced size, thereby avoiding an increase in chip size, while being suitable for application as a DDR SDRAM. It is a further object of the present invention to provide a method of forming the above-noted semiconductor memory device.

SUMMARY OF THE INVENTION

To achieve the above-noted object, the present invention adopts the following basic technical constitution.

Specifically, the first aspect of a semiconductor memory device according to the present invention is a semiconductor memory device comprising: a plurality of data pads; a plurality of first stage circuits; a plurality of data latch circuits; and an internal clock signal generating circuit; wherein data that is introduced to the data pads is fed via the first stage circuits to the data latch circuits, the data latch circuits latching the data on a rising edge and on a falling edge of a clock signal generated by the internal clock signal generating circuit, the plurality of data pads are arranged in a straight line so as to form a data pad row, the data latch circuits are disposed in a region surrounded between a second straight line which is perpendicular to a first straight line that passes over the data pad row and which also passes one end of the plurality of data pads and a third straight line, which is parallel to the second straight line and which passes another end of the plurality of data pads, the length of interconnections between each of the plurality of data latch circuits and the internal clock signal generating circuit is made the same, the wiring length from the first stages to the data latch circuits is made the same as the length of the wiring from the internal clock signal generating circuit to each of the data latch circuits, and the first stage circuits, data latch circuits, and the internal clock signal generating circuit are operated by a voltage that has been dropped from an external power supply.

In the second aspect of the present invention, the plurality of data latch circuits are disposed at the center part of the region surrounded by the second straight line and the third line in a concentrated manner.

In the third aspect of the present invention, the internal clock signal generating circuit for generating a clock signal for the data latch circuits is disposed in a region that is not surrounded by the second straight line and the third straight line, and in proximity to one end of the row of data latch circuits.

In the fourth aspect of the present invention, the plurality of data pads and the plurality of data latch circuits are disposed substantially symmetrically with respect to a fourth straight line provided between the second straight line and the third straight line.

In the fifth aspect of the present invention, a first data latch circuit and a second data latch circuit of the plurality of data latch circuits are disposed so as to be mirror images with respect to a fifth straight line.

In the sixth aspect of the present invention, the first data latch circuit and the second data latch circuit of said plurality of data latch circuits are arranged in a line as if they move in parallel along a seventh straight line that is perpendicular to the fifth straight line.

In the seventh aspect of the present invention, the first data latch circuit, the second data latch circuit, a third data latch circuit, and a fourth data latch circuit of the plurality of data latch circuits are disposed so as to be mirror images with respect to a sixth straight line, witch is parallel to the fifth straight line.

In the eight aspect of the present invention, the third data latch circuit and the fourth data latch circuit of the plurality of data latch circuits are arranged in a line as to be adjacent to the first or the second data latch circuits so as to move in parallel along the seventh straight line.

In the ninth aspect of the present invention, a first through fourth data latch circuits and a fifth to eight data latch circuits of the plurality of data latch circuits are arranged so as to be mirror images with respect to a seventh line, which is perpendicular to the fifth straight line.

In the tenth aspect of the present invention, a first to eighth data latch circuits and a ninth to sixteenth data latch circuits of the plurality of data latch circuits are arranged so as to be mirror images with respect to an eighth straight line, which is parallel to the fifth straight line.

The first aspect of a method for forming a semiconductor memory device according to the present invention is a method for forming a semiconductor memory device comprising: a plurality of data pads; a plurality of first stage circuits; and a plurality of data latch circuits; an internal clock signal generating circuit; wherein data that is introduced to said data pads is fed via the first stage circuits to the data latch circuits, the data latch circuits latching the data on a rising edge and on a falling edge of a clock signal generated by the internal clock signal generating circuit, this method having: a first step of arranging a plurality of data pads in a row to form a data pad row; a second step of arranging individual first stage circuits so as to be adjacent to the data pads; a third step of disposing the clock signal generating circuit outside an area that is surrounded by a second straight line which is perpendicular to a first line that passes through the row of data pads and which also passes through a first end of the row of data pads, and a third straight line, which passes through the second end of the row of data pads, and also disposing the clock signal generating circuit in proximity to one end of the row of data pads; a fourth step of adjusting the length of each wire connection between each data latch circuit and the internal clock signal generating circuit to be the same length, and also adjusting the wiring length from each first stage circuit to each data latch circuit so as to be the same as the length of the connection from the internal clock signal generating circuit to a data latch circuit; a fifth step of disposing the plurality of data latch circuits centrally in a region that is surrounded by the second straight line, which is perpendicular to the first line that passes through the row of data pads and which also passes through a first end of the row of data pads and the third straight line, which passes through the second end of the row of data pads; and a sixth step of disposing the plurality of data latch circuits.

In the second aspect of a method of forming a semiconductor memory device according to the present invention, the first stage circuits, the data latch circuits, and the internal clock signal generating circuit are operated by a voltage that has been dropped from an external power supply.

In the third aspect of a method of forming a semiconductor memory device according to the present invention, the plurality of data latch circuits are disposed substantially in the center of the region that is surrounded by the second straight line and the third straight line in a concentrated manner.

By adopting the above-described constitution, it is possible to achieve a DDR SDRAM with a small interconnect region and element region, thereby preventing an increase in the chip to a large size.

By operating the above-noted data latch circuits and internal clock signal generating circuit from a voltage that is dropped from an external power supply, it is possible to obtain a DDR SDRAM having a lower power consumption.

DESCRIPTION OF THE PREFERRED EMBODIMENTS

Preferred embodiments of the present invention are described below in detail, with references being made to relevant accompanying drawings.

Figure 8:
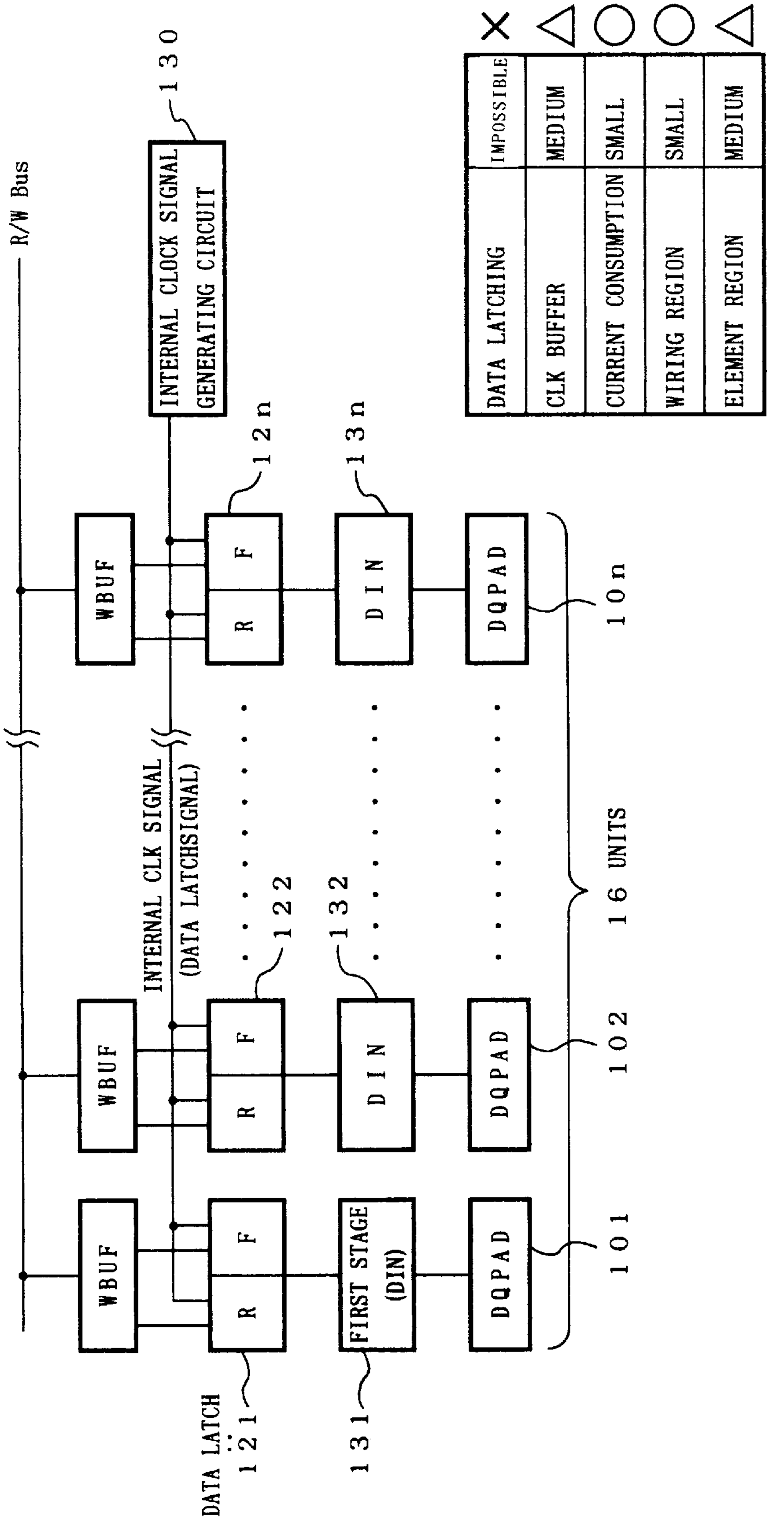
FIG. 8 is a block diagram of a DDR SDRAM having the same configuration as shown in FIG. 7.
Figure 9:
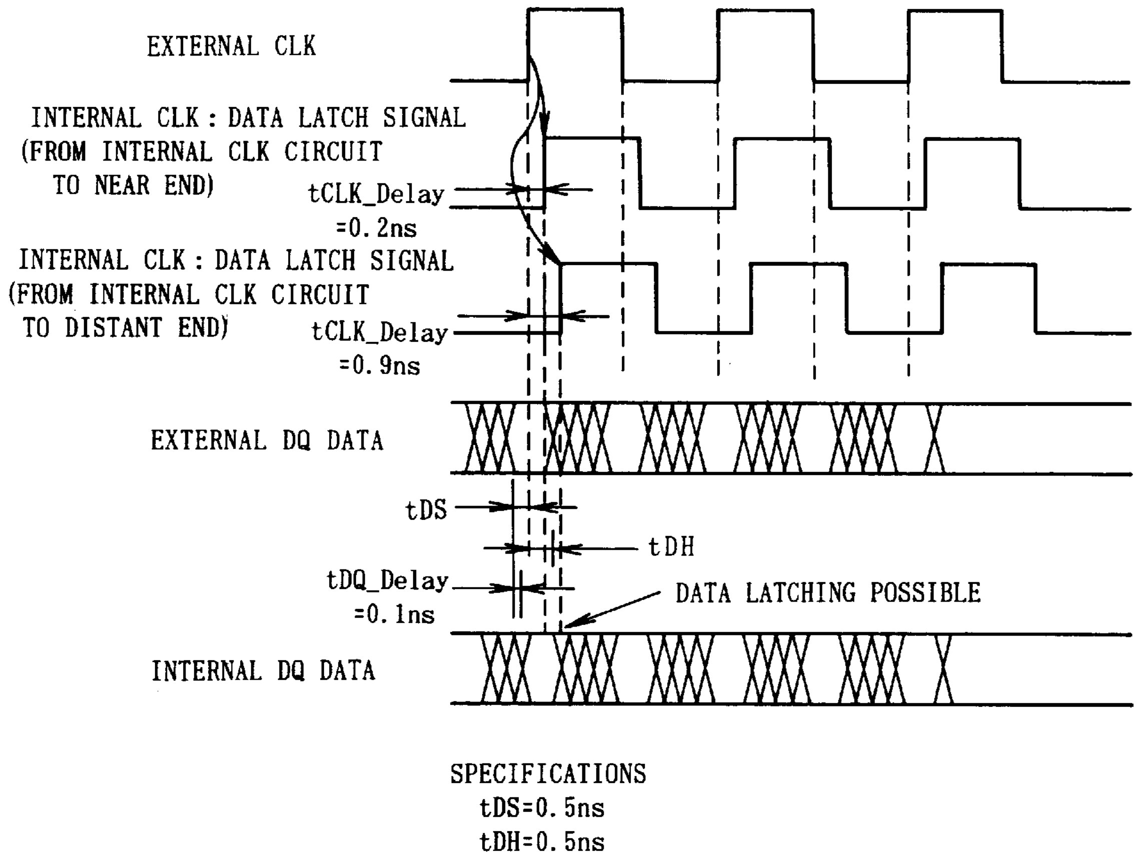
FIG. 9 is a waveform timing diagram showing the data latch circuit of FIG. 8.
Figure 10:
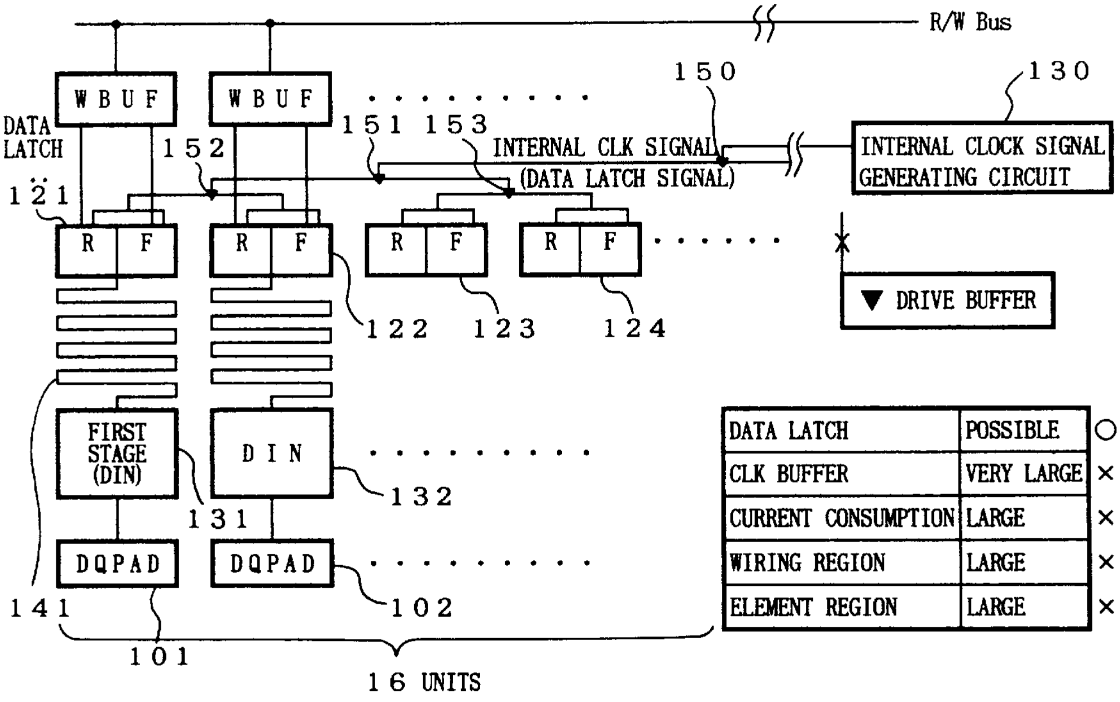
FIG. 10 is a block diagram of the first example of the present invention, which is an improvement on the DDR SDRAM of FIG. 8.
Figure 10:
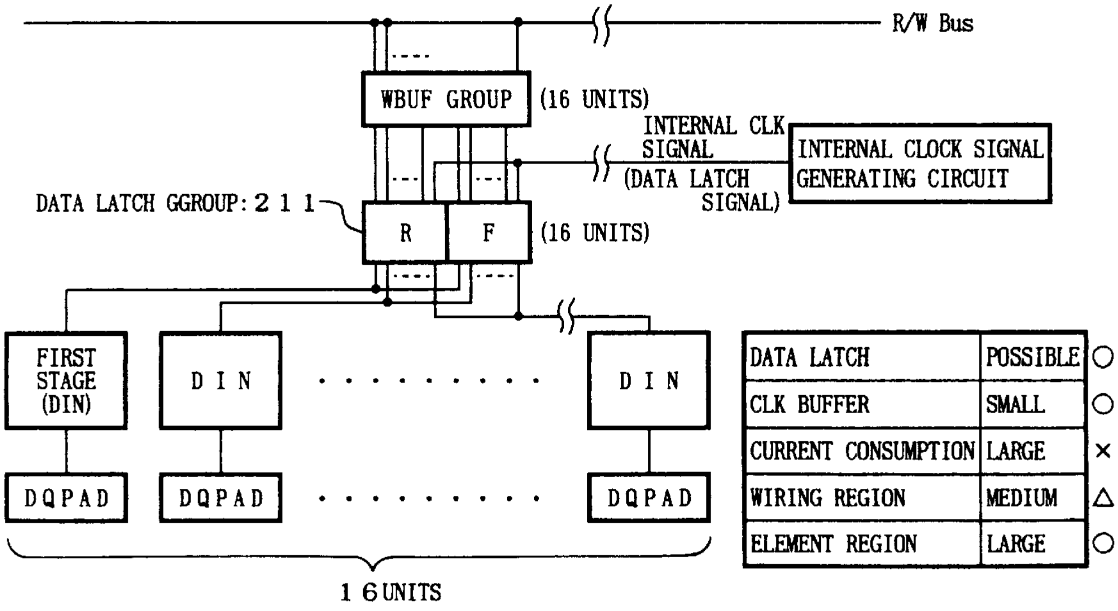

FIG. 10 is the first embodiment of the present invention, which is an improvement of the DRAM shown in FIG. 8.

Figure 7:
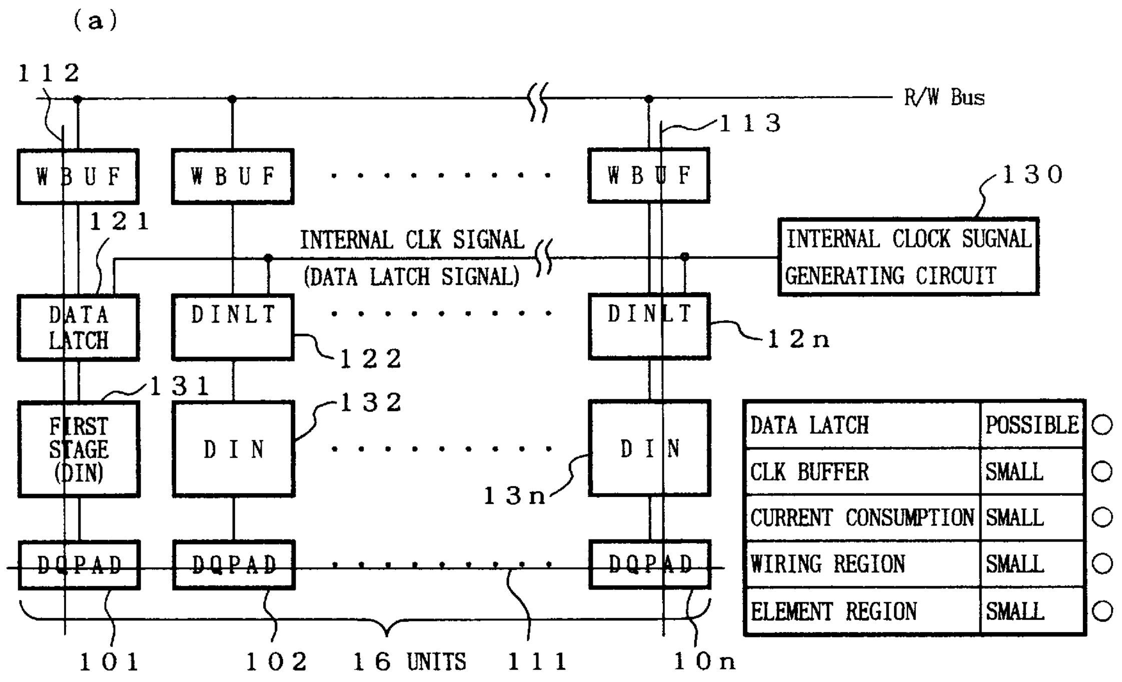
FIG. 7 is a block diagram of a SDR SDRAM of the past.
Figure 7:
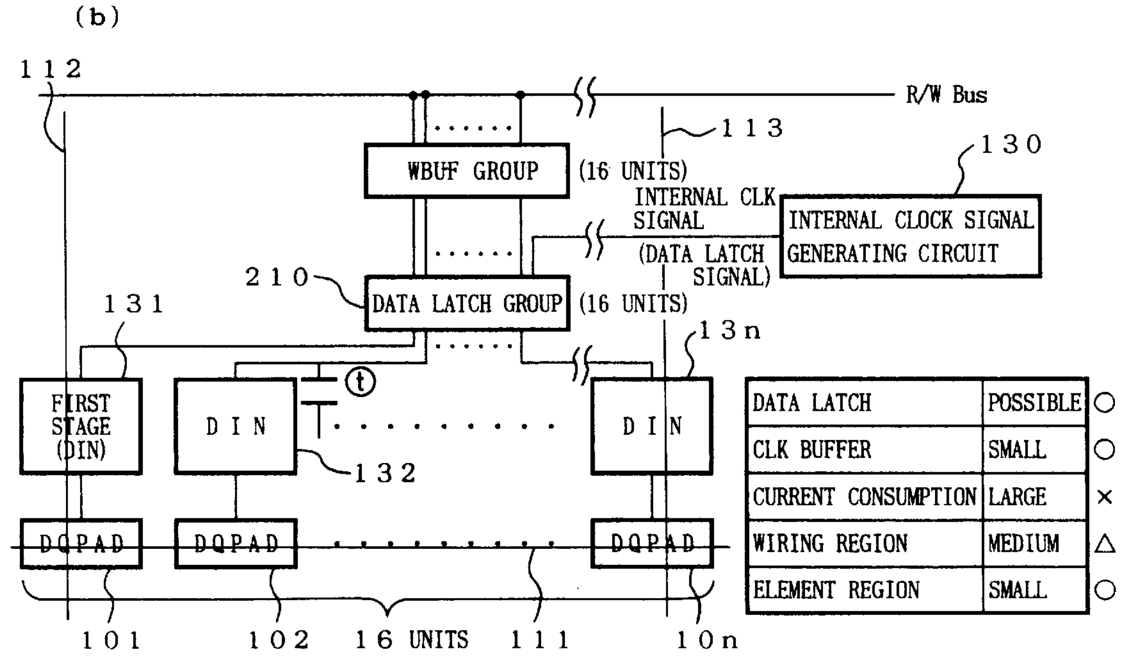

In FIG. 10(*a*), the same as the case of FIG. 7, data latch circuits 121, 122, . . . , 12n are disposed in a region above data pads, the wiring between each data latch circuit and the internal clock signal generating circuit being in the form of a tree, with interconnects of the same length. In order to adjust the length of each data wire to the length of the clock connections, the connections 141 between each of the first stages (131, 132, . . . ) and the data latch circuits (121, 122, . . . ) are arranged so that they are the same length as the wiring from the data latch circuits (121, 122, . . . ) to the internal clock signal generating circuit 130. In this circuit, however, while data latching is possible, because a tree-structure wiring arrangement is used, there are additional drive buffers (150, 151, . . . ) in order to compensate for the wiring load, the result being an increase in the size of the element region, and an increase in the size of the interconnect region due to the dressing of interconnections 141 for the purpose of adjusting the length of the interconnects, thereby causing problems such as an increase in the current consumption.

FIG. 10(*b*) shows the case in which a circuit group 211, comprising a plurality of data latch circuits is centrally disposed in the center part at the top of the data pad row in the same manner as in FIG. 7(*b*). In this case, because the data latch circuits are concentrated in the center part, in contrast with the case of FIG. 10(*a*), there is no need for the drive buffers. Even in the case of the circuit of FIG. 10(*b*), however, because of the length of each interconnection, there is still the problem of a large current consumption.

Figure 1:
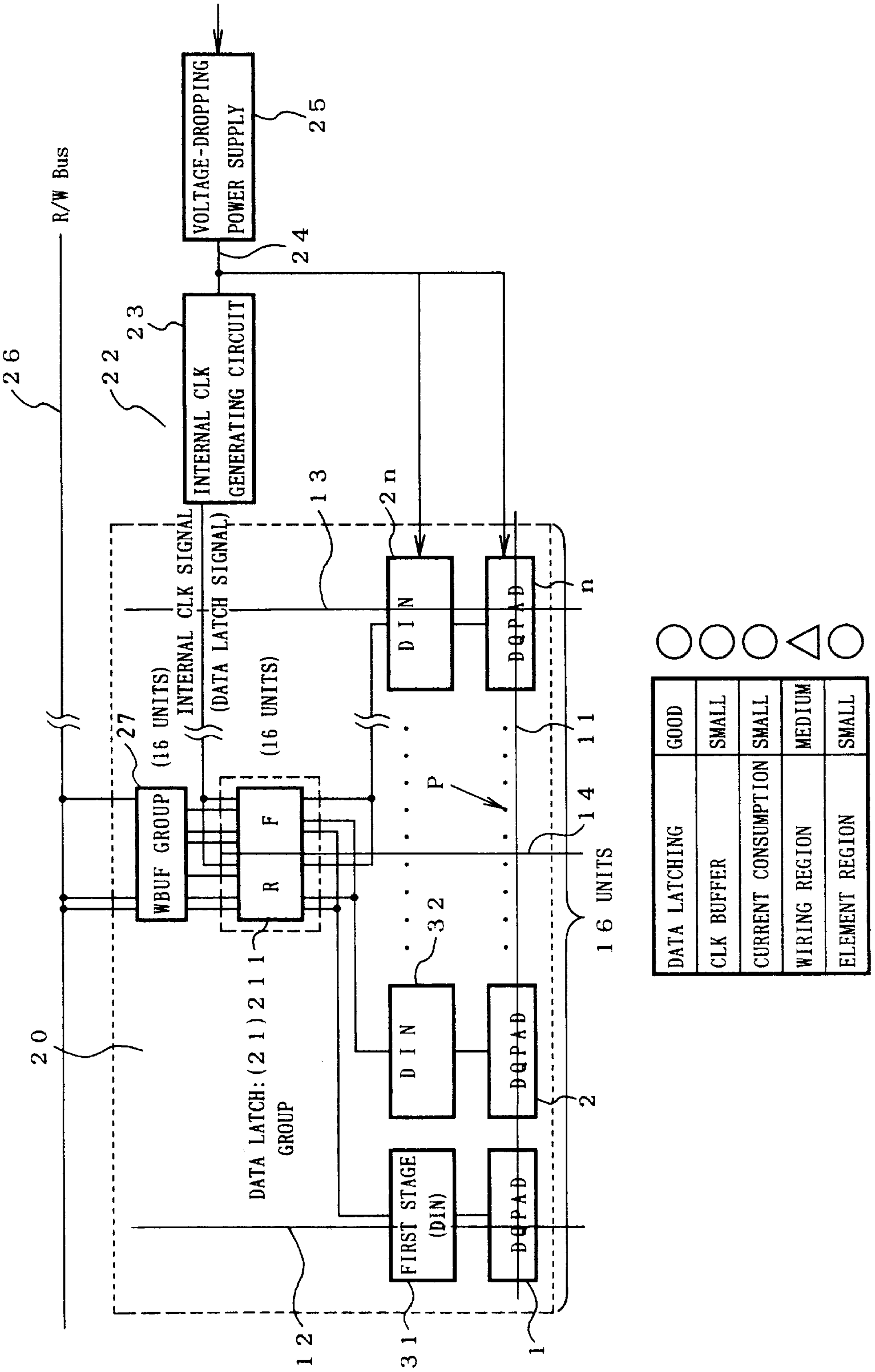
FIG. 1 is a block diagram showing a second example of a DDR SDRAM according to the present invention.

FIG. 1 shows the construction of the second embodiment of a semiconductor memory device according to the present invention. This drawing shows a synchronous DRAM having data pads (DQPAD) 1, 2, . . . , n in which data that is fed to data pads 1, 2, . . . , n is fed via the first stage circuits (DIN) 31, 32, . . . , 3n to individual data latch circuits 21, which latches the data at both the rising edge and the falling edge of a clock signal generated by an internal clock signal generating circuit 23.

This synchronous DRAM is configured so that the plurality of data pads 1, 2, . . . , n is arranged in a row so as to form a data pad row P, and a plurality of data latch circuits 21 that latch the signals from the various data pads 1, 2, . . . , n are disposed in a region that is surrounded by second straight line 12 that is perpendicular to a first straight line that passes over the data pad row P and that passes over one end of the data pad row P and a third straight line 13 that is parallel to the second straight line 12 and that pass the other end of the data pad row P (this region being referred to hereinafter simply as the data pad upper region). The length of interconnections between each first stage (DIN) to each of the data latch circuits 21 is adjusted in this DRAM to be the same as the length of the interconnection between the internal clock signal generating circuit 23 to the data latch circuit 21, and the first stages (DIN), the data latch circuits 21, and the internal clock signal generating circuit 23 are caused to operate by a voltage that is dropped from an external power supply. In this DRAM the plurality of data latch circuits are disposed substantially in the center of the region 20 that is surrounded by the second straight line 12 and the third straight line 13.

In the case of the above-noted arrangement, it is desirable that the internal clock signal generating circuit 23, which generates a clock signal for the data latch circuits, be disposed in a region outside the region surrounded by the second straight line 12 and the third straight line 13, and in proximity to an end of the data pad row P.

It is also desirable that the plurality of data pads 1, 2, . . . , n and the plurality of data latch circuits 21 be disposed so as to be symmetrical about a fourth straight line 14, which is provided between the second straight line 12 and the third straight line 13.

It is desirable that the first stage circuits DIN, the data latch circuits 21, and the internal clock signal generating circuit 23 be operated by a voltage 24 that is dropped from an external power supply.

The second embodiment of the present invention is described in further detail below.

FIG. 1 shows the arrangement in which the data pads 1, 2, . . . , n are arranged in a row, with first stage circuits 31, 32, . . . , 3n corresponding to these data pads being disposed in a region 20 above the data pads, a data latch circuit group 211, comprising a plurality of data latch circuits 21, being disposed centrally in the region 20 above the data pad row P, and the internal clock signal generating circuit 23 being adjacent to the data pad row P in a position that is outside the region 20.

Additionally, the lengths of the interconnections between the data latch circuits 21 and the internal clock signal generating circuit 23 is adjusted so as to be the same lengths, the length of the interconnections from each of the first stage circuits 31, 32, . . . , 3n to each of the data latch circuits 21 is adjusted to be the same as the length of the interconnection between the internal clock signal generating circuit 23 to the data latch circuits 21 and, to limit the current consumption caused by interconnections, the first stage circuits 31, 32, . . . , 3n, the data latch circuits 21, and the internal clock signal generating circuit 23 are driven from a power supply voltage 25 that is internally dropped from an output voltage 24. In terms of operation, data is input from the data pads, passes through the first stage circuits, and is fed to the individual data latch circuits, this input data being latched on both the rising edge and the falling edge of the clock signal (CLK) from the internal clock signal generating circuit 23.

In FIG. 1, the reference numeral 26 denotes a read/write bus and 27 is a buffer that writes the output from the data latch circuit 21 to the read/write bus 26. It should be noted that this drawing is a block diagram of the write system.

Data latching in the DDR SDRAM according to the present invention is performed as follows.

Each of the data that is read in from the data pads (DQPADs) is input to a data latch circuit 21 via a first stage circuit (DIN). The input data is then latched by the rising edge and the falling edge of the internal clock signal (data latch signal) that is synchronized to an external clock signal.

Figure 2:
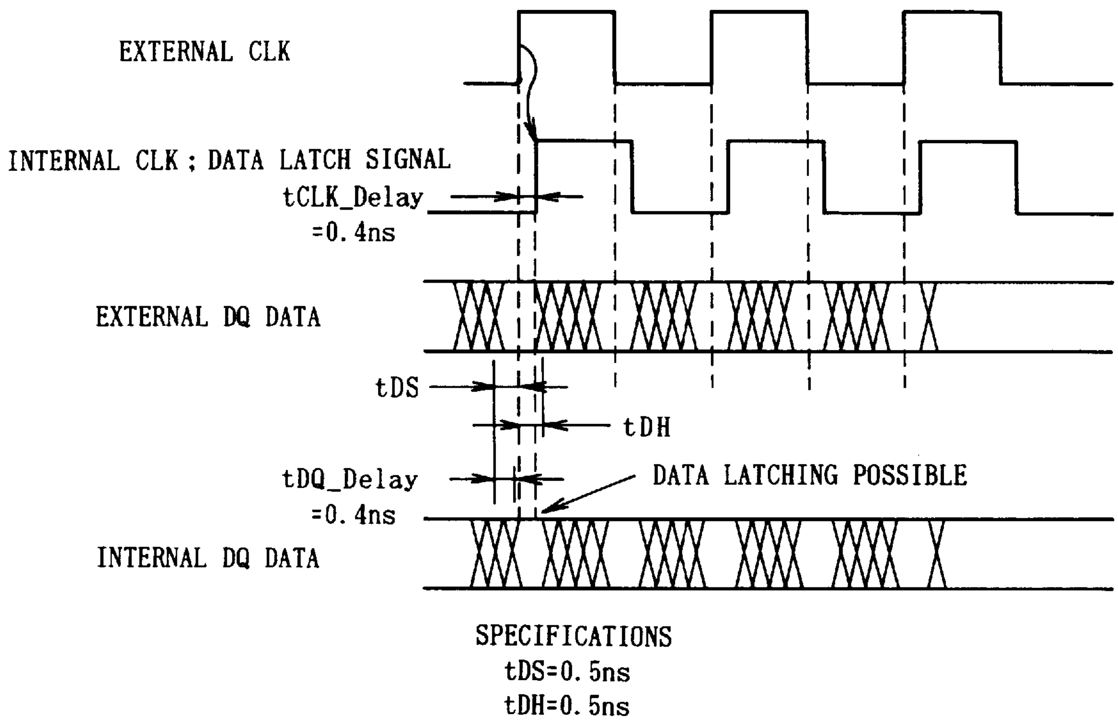
FIG. 2 is a waveform timing diagram illustrating the data latch shown in FIG. 1.

The timing of the latching operation is as follows. Referring to the waveform timing diagram of FIG. 2, the delay of the internal clock signal with respect to the external clock signal is tCLK delay=0.4 ns, and the delay fo the internal data with respect to the external data is tDQ Delay=0.4 ns (for the case in which the interconnection length from the first stage circuit to the data latch circuit is equal to the interconnection length from the internal clock signal generating circuit to the data latch circuit).

Additionally, tDH (data hold time)=0.5 ns.

The condition for data latching is that the rising edge of the internal clock signal be input within the time tDH+tDQ Delay after the rising edge of the external clock signal, latching is possible if tDH+tDQ Delay>tCLK Delay. In this case, tDH+tDQ Delay=0.9 ns>tCLK Delay=0.4 ns, so that data latch by the data latch cicuit in the present invention is possible.

Figure 3:
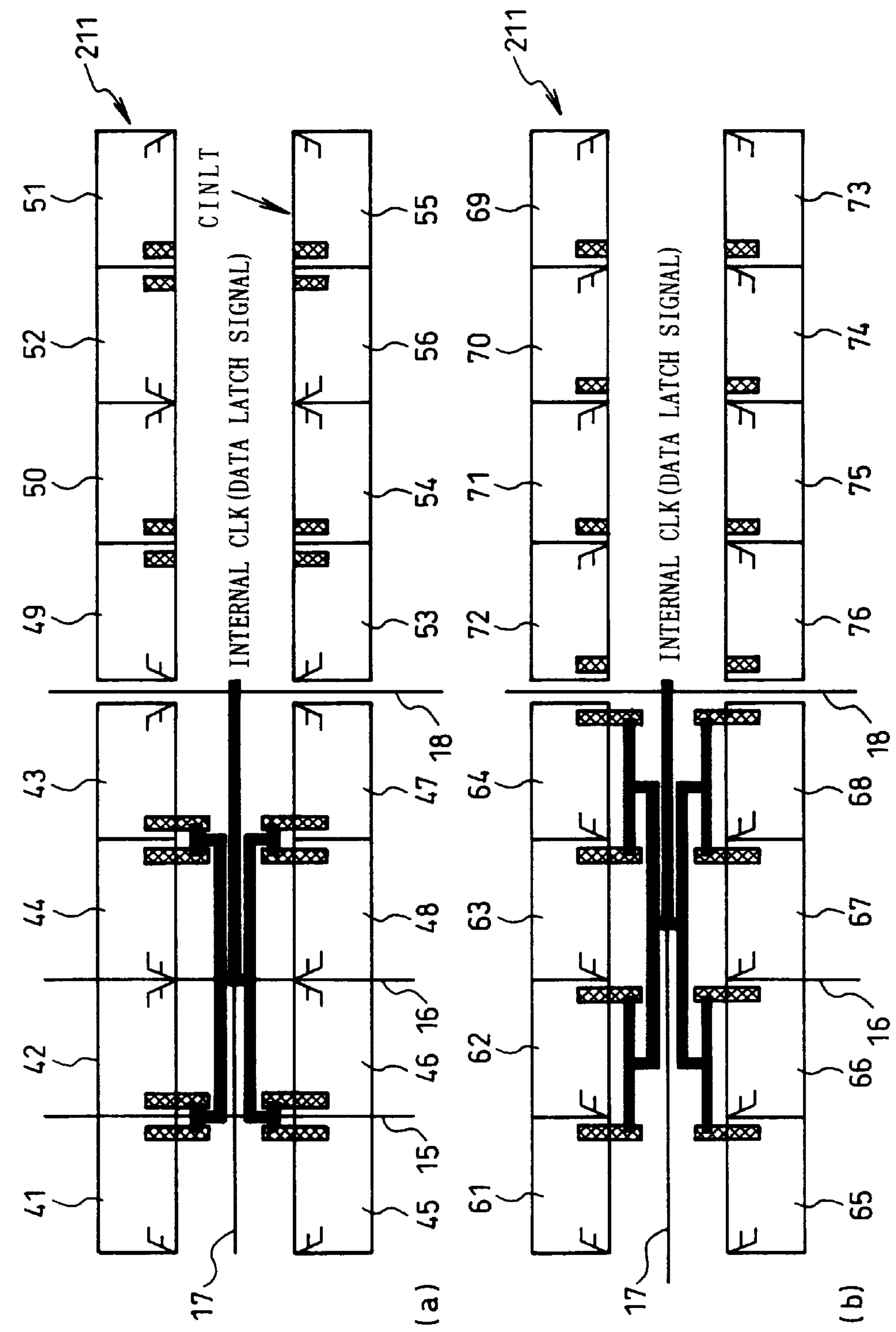
FIG. 3 is a drawing showing the mask positioning method for the latch circuit.
Figure 4:
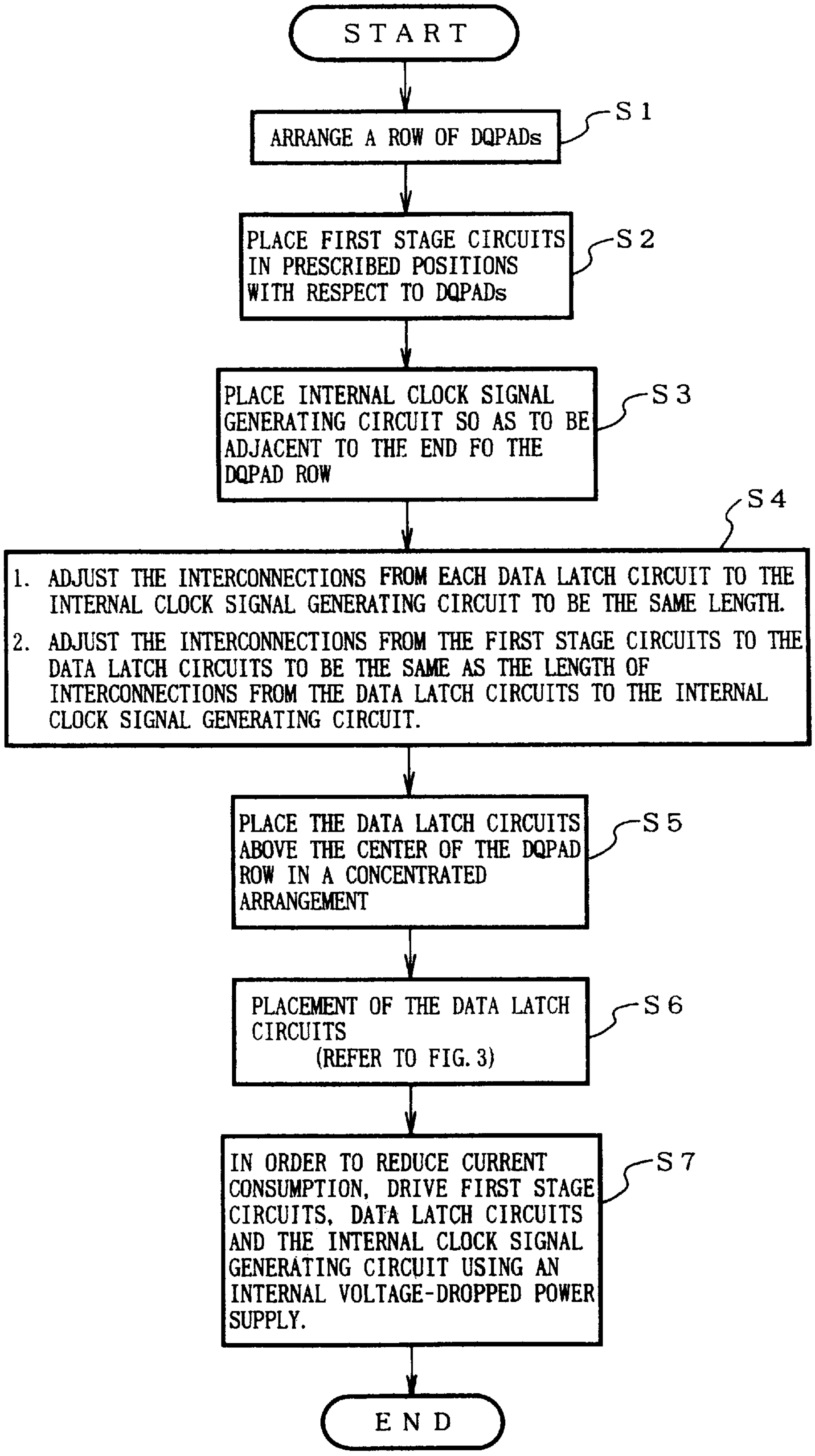
FIG. 4 is a flowchart showing the method of forming a semiconductor memory device according to the present invention.

FIG. 3 and FIG. 4 show the method of mask arrangement for a data latch circuit. In FIG. 3(*a*), the first data latch circuit 41 and the second data latch circuit 42 of the plurality of data latch circuit groups 211 are arranged so as to be mirror images with respect to the fifth straight line 15.

The first data latch circuit 41, the second data latch circuit 42, the third data latch circuit 43, and the fourth data latch circuit 44 are arranged so as to be in a mirror image relationship with respect to the sixth straight line 16, which is parallel to the fifth straight line 15.

The first to the fourth data latch circuits 41 to 44 and the fifth to the eight data latch circuits 45 to 48 of the plurality of data latch circuit groups are arranged so as to be in mirror image relationship with respect to the seventh straight line 17, which is perpendicular to the fifth straight line 15.

Additionally, the first to eight data latch circuits 41 to 48 and the ninth to the sixteenth data latch circuits 49 to 55 of the plurality of data latch circuit groups are arranged so as to be in mirror image relationship with respect to the eight straight line 18, which is parallel to the fifth straight line 15.

By adopting the above-noted arrangement, it is possible to make the length of the interconnections between the internal clock signal generating circuit 23 and each of the data latch circuits 41 to 55 equal.

FIG. 3(*b*) shows another example of a mask arrangement method for a data latch circuit. In FIG. 3(*b*), the first data latch circuit 61 and the second data latch circuit 62 of the plurality of data latch circuit groups are arranged so as to move in parallel along the seventh straight line 17.

The third data latch circuit 63 and the fourth data latch circuit 64 of the plurality of data latch circuit groups are arranged so as to be adjacent to the first or the second data latch circuit, so that there is parallel movement along the seventh straight line 17.

The first to the fourth data latch circuits 61 to 64 and the fifth through the eight data latch circuits 65 to 68 of the plurality of data latch circuit groups are disposed so that they are in mirror image relationship with respect to the seventh straight line 17.

Additionally, the first to the eight data latch circuits 61 to 68 and the ninth to the sixteenth data latch circuits 69 to 76 of the plurality of data latch circuit groups are disposed so as to be in mirror image relationship with respect to the eight straight line 18.

In the case of the above-noted arrangement, the first data latch circuit 61, the second data latch circuit 62, the third data latch circuit 63, and the fourth data latch circuit 64 are disposed so as to be in mirror image relationship with respect to the sixth straight line 16.

Comparing the arrangements of FIG. 3(*a*) and FIG. 3(*b*), it can be seen that the circuit of FIG. 3(*a*) has a shorter total interconnection length and smaller wiring capacitance, thereby enabling faster operation than the arrangement shown in FIG. 3(*b*).

Automatic interconnection placement for the above-noted DDR SDRAM is described below.

Figure 5:
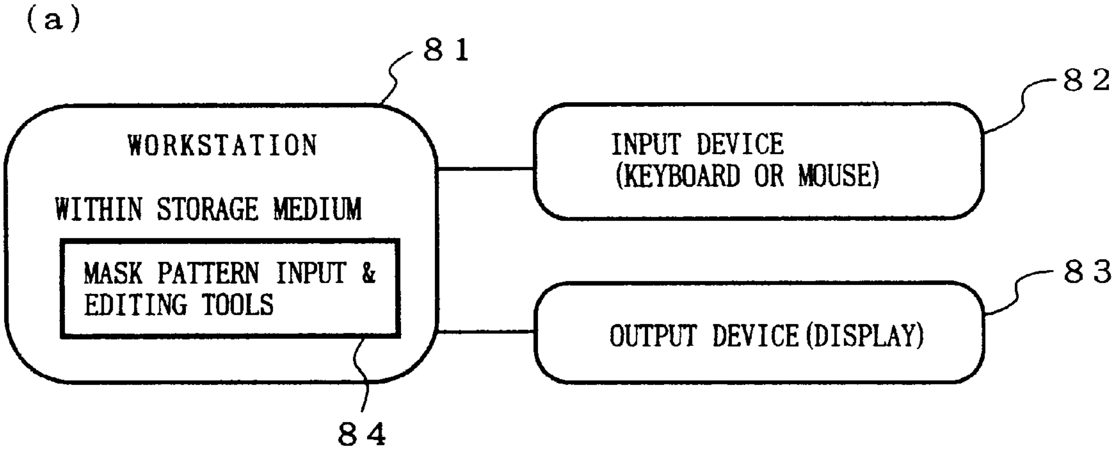
FIG. 5 is a drawing showing a system for forming a semiconductor memory device according to the present invention.
Figure 5:
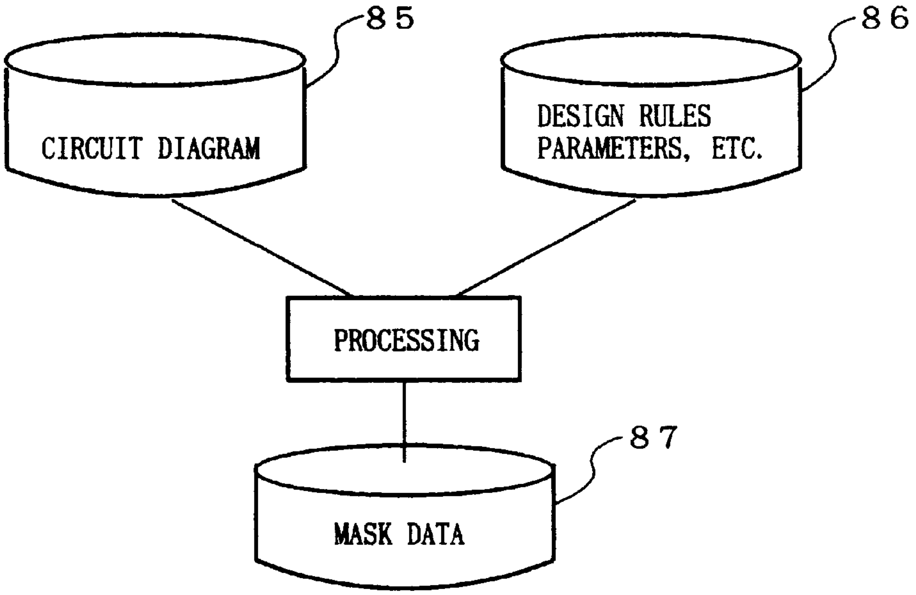

As shown in FIG. 5(*a*), this is accomplished using a system comprising a workstation 81, a keyboard or mouse serving as an input device 82, a display serving as an output device 83, and a tool 84 for inputting and editing a mask pattern.

As shown in FIG. 5(*b*), design rules and parameters 86 bases on a circuit diagram 75 are input and edit a mask pattern, thereby generating the mask data 87.

The flow in the tool for the above-noted system is described below, with reference to FIG. 4.

At step S1 a row of data pads (DQ PADs) is created.

At step S2, a first stage circuit (DIN) is placed in a prescribed region near each of the data pads.

At step S3, an internal clock signal generating circuit is placed so as to be adjacent to an end of the data pad row.

At step S4, in consideration of the conditions for data latching, the length of the interconnections from each data latch circuit to the internal clock signal generating circuit is adjusted so as to be the same, and the lengths of interconnections from the first stage circuits to the data latch circuits are made the same as the length of the interconnection between the data latch circuits and the internal clock signal generating circuit.

At step S5, in order to enable data latching, the data latch circuits are disposed in a centralized manner, as shown in FIG. 1, and the interconnection lengths of input signals to the data latch circuits are adjusted.

At step S6, when the data latch circuit are centrally placed, placement is made so that the interconnect lengths from the internal clock signal generating circuit to each data latch circuit is the same and is a short length.

At step S7, the current consumption, which increased because of the increase in the length of interconnections, is limited by driving the first stage circuits, the data latch circuits, and the internal clock signal generating circuit using an output voltage of an internal voltage-dropped power supply.

Figure 6:
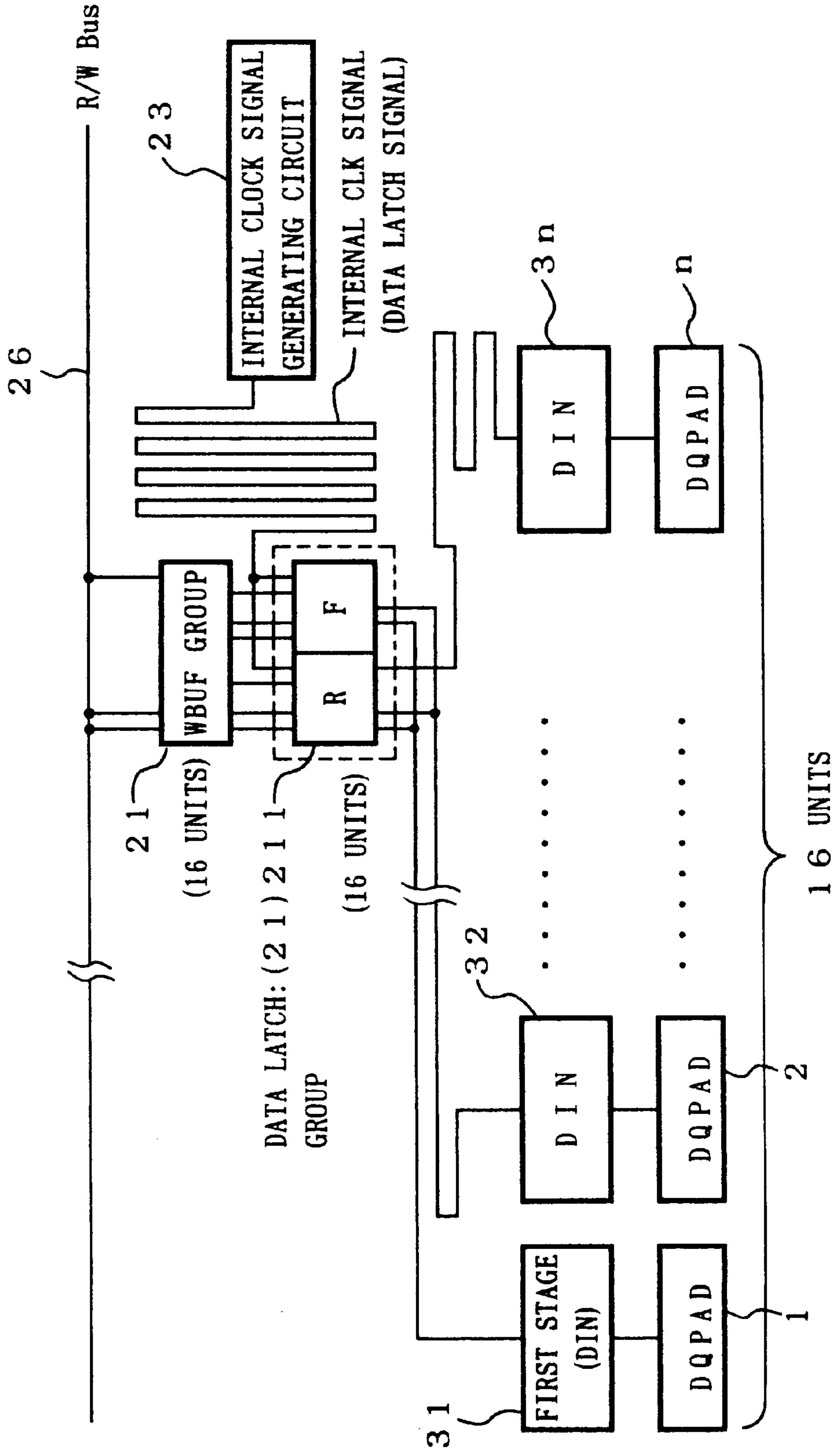
FIG. 6 is a block diagram showing another example of the present invention.

FIG. 6 shows an example in which a data latch circuit group that is disposed in a concentrated manner is not disposed at the center of the region 20 of FIG. 1. While in this configuration, because the interconnection lengths are greater than in FIG. 1, there is a problem with an increase in the current consumption, because data is reliably latched, this configuration can be used, depending upon the interconnection conditions on the chip.

By adopting the above-noted configuration, the present invention provides a number of effect.

With the same write block arrangement in a DDR DRAM as in an SDR DRAM, when data is latched, latching of data is not possible, but in the present invention, it is possible to adjust the signal delay times, so that data latching becomes possible.

As shown in FIG. 3, the signal branch points provided to achieve equal length of interconnections are located close to the data latch circuits, the result being that a drive buffer is not needed, thereby avoiding an increase in the size of the chip.

By driving the first stage circuits, the data latch circuits, and the internal clock signal generating circuit by the output voltage of an internal voltage-dropped power supply, even if the first stage circuits are disposed at a distance from the data latch circuits, it is possible to limit the increase in the current consumption.

What is claimed is:

1. A semiconductor memory device comprising:

a plurality of data pads;

a plurality of first stage circuits;

a plurality of data latch circuits; and an internal clock signal generating circuit;

wherein data that is introduced to said data pads is fed via said first stage circuits to said data latch circuits, said data latch circuits latching said data on a rising edge and on a falling edge of a clock signal generated by said internal clock signal generating circuit, said plurality of data pads are arranged in a straight line so as to form a data pad row, said data latch circuits are disposed in a region surrounded between a second straight line which is perpendicular to a first straight line that passes over said data pad row and which also passes one end of said plurality of data pads and a third straight line, which is parallel to said second straight line and which passes another end of said plurality of data pads, the length of interconnections between each of said plurality of data latch circuits and said internal clock signal generating circuit is made the same, the wiring length from said first stages to said data latch circuits is made the same as the length of the wiring from said internal clock signal generating circuit to each of said data latch circuits, and said first stage circuits, data latch circuits, and the internal clock signal generating circuit are operated by a voltage that has been dropped from an external power supply.

2. A semiconductor memory device according to claim 1, wherein said plurality of data latch circuits are disposed at the center part of said region surrounded by said second straight line and said third line in a concentrated manner.

3. A semiconductor memory device according to claim 1, wherein said internal clock signal generating circuit for generating a clock signal for the data latch circuits is disposed in a region that is not surrounded by said second straight line and said third straight line, and in proximity to one end of said row of data latch circuits.

4. A semiconductor memory device according to claim 1, wherein said plurality of data pads and said plurality of data latch circuits are disposed substantially symmetrically with respect to a fourth straight line provided between said second straight line and said third straight line.

5. A semiconductor memory device according to claim 1, wherein a first data latch circuit and a second data latch circuit of said plurality of data latch circuits are disposed so as to be mirror images with respect to a fifth straight line.

6. A semiconductor memory device according to 1, wherein a first data latch circuit and a second data latch circuit of said plurality of data latch circuits are arranged in a line as if they move in parallel along a seventh straight line that is perpendicular to the fifth straight line.

7. A semiconductor memory device according to claim 5, wherein a first data latch circuit, a second data latch circuit, a third data latch circuit, and a fourth data latch circuit of said plurality of data latch circuits are disposed so as to be mirror images with respect to a sixth straight line, witch is parallel to said fifth straight line.

8. A semiconductor memory device according to claim 5, wherein a third data latch circuit and a fourth data latch circuit of said plurality of data latch circuits are arranged in a line as to be adjacent to said first or said second data latch circuits so as to move in parallel along said seventh straight line.

9. A semiconductor memory device according to claim 7, wherein a first through fourth data latch circuits and a fifth to eight data latch circuits of said plurality of data latch circuits are arranged so as to be mirror images with respect to a seventh line, which is perpendicular to said fifth straight line.

10. A semiconductor memory device according to claim 7, wherein a first to eighth data latch circuits and a ninth to sixteenth data latch circuits of said plurality of data latch circuits are arranged so as to be mirror images with respect to an eighth straight line, which is parallel to said fifth straight line.

11. A method for forming a semiconductor memory device comprising:

a plurality of data pads;

a plurality of first stage circuits; and a plurality of data latch circuits;

an internal clock signal generating circuit;

wherein data that is introduced to said data pads is fed via said first stage circuits to said data latch circuits, said data latch circuits latching said data on a rising edge and on a falling edge of a clock signal generated by said internal clock signal generating circuit, this method comprising:

a first step of arranging a plurality of data pads in a row to form a data pad row;

a second step of arranging individual first stage circuits so as to be adjacent to said data pads;

a third step of disposing said clock signal generating circuit outside an area that is surrounded by a second straight line which is perpendicular to a first line that passes through said row of data pads and which also passes through a first end of said row of data pads, and a third straight line, which passes through the second end of said row of data pads, and also disposing said clock signal generating circuit in proximity to one end of said row of data pads;

a fourth step of adjusting the length of each wire connection between each said data latch circuit and said internal clock signal generating circuit to be the same length, and also adjusting the wiring length from each first stage circuit to each data latch circuit so as to be the same as the length of the connection from said internal clock signal generating circuit to a data latch circuit;

a fifth step of disposing said plurality of data latch circuits centrally in a region that is surrounded by said second straight line, which is perpendicular to said first line that passes through said row of data pads and which also passes through a first end of said row of data pads and said third straight line, which passes through the second end of said row of data pads; and a sixth step of disposing said plurality of data latch circuits.

12. A method for forming a semiconductor memory device according to claim 11, wherein said first stage circuits, said data latch circuits, and said internal clock signal generating circuit are operated by a voltage that has been dropped from an external power supply.

13. A method of forming a semiconductor memory device according to claim 11, wherein said plurality of data latch circuits are disposed substantially in the center of said region that is surrounded by said second straight line and said third straight line in a concentrated manner.

14. A computer software for designing a semiconductor memory device comprising:

a plurality of data pads;

a plurality of first stage circuits; and a plurality of data latch circuits;

an internal clock signal generating circuit;

wherein data that is introduced to said data pads is fed via said first stage circuits to said data latch circuits, said data latch circuits latching said data on a rising edge and on a falling edge of a clock signal generated by said internal clock signal generating circuit, this computer software comprising:

a first means of arranging a plurality of data pads in a row to form a data pad row;

a second means of arranging individual first stage circuits so as to be adjacent to said data pads;

a third means of disposing said clock signal generating circuit outside an area that is surrounded by a second straight line which is perpendicular to a first line that passes through said row of data pads and which also passes through a first end of said row of data pads, and a third straight line, which passes through the second end of said row of data pads, and also disposing said clock signal generating circuit in proximity to one end of said row of data pads;

a fourth means of adjusting the length of each wire connection between each said data latch circuit and said internal clock signal generating circuit to be the same length, and also adjusting the wiring length from each first stage circuit to each data latch circuit so as to be the same as the length of the connection from said internal clock signal generating circuit to a data latch circuit;

a fifth means of disposing said plurality of data latch circuits centrally in a region that is surrounded by said second straight line, which is perpendicular to said first line that passes through said row of data pads and which also passes through a first end of said row of data pads and said third straight line, which passes through the second end of said row of data pads; and a sixth means of disposing said plurality of data latch circuits.

* * * * *